United States Patent [19]
Burkey et al.

[11] Patent Number: 5,115,458
[45] Date of Patent: May 19, 1992

[54] REDUCING DARK CURRENT IN CHARGE COUPLED DEVICES

[75] Inventors: Bruce Burkey, Rochester; Win-Chyi Chang, Penfield; Teh-Hsuang Lee, Webster, all of N.Y.

[73] Assignee: Eastman Kodak Company, Rochester, N.Y.

[21] Appl. No.: 725,957

[22] Filed: Jun. 27, 1991

Related U.S. Application Data

[63] Continuation of Ser. No. 402,735, Sep. 5, 1989, abandoned.

[51] Int. Cl.$^5$ .................. G11C 19/28; H01L 29/78; H01L 27/14; H04N 3/14
[52] U.S. Cl. .......................... 377/58; 357/24; 357/30; 358/213.16
[58] Field of Search ............... 357/24, 30; 377/57-63; 358/213.16

[56] References Cited

U.S. PATENT DOCUMENTS

| | | | |
|---|---|---|---|
| 3,931,465 | 1/1976 | Levine | 357/24 LR |
| 4,328,432 | 5/1982 | Yamazaki | 357/24 LR |
| 4,485,315 | 11/1984 | Collet et al. | 357/24 LR |
| 4,613,402 | 9/1986 | Losee et al. | 357/24 M |
| 4,621,369 | 11/1986 | Narabu et al. | 357/24 M |
| 5,008,758 | 4/1991 | Burke | 358/213.16 |

OTHER PUBLICATIONS

Sze, Physics of Semiconductor Devices, 1st Edition, John Wiley, N.Y. 1969, pp. 38-39, 426-429.

Primary Examiner—Gene M. Munson
Attorney, Agent, or Firm—Raymond L. Owens

[57] ABSTRACT

In a CCD in which a pixel is defined by at least two adjacent gate electrodes, voltages are applied to both gate electrodes to simultaneously place both gates of each pixel in a mode of operation whereby holes are accumulated at the surface of a substrate in which the CCD is formed. Preferably one of these voltages is at a higher potential level than the other.

6 Claims, 5 Drawing Sheets

REDUCING DARK CURRENT IN CHARGE COUPLED DEVICES

This is a continuation of application Ser. No. 402,735, filed Sept. 5, 1989, now abandoned.

FIELD OF THE INVENTION

This invention relates to a method and apparatus for reducing dark current in charge coupled devices (CCDs).

BACKGROUND OF THE INVENTION

A true two phase CCD refers to a device in which there are two physical gates per pixel, with each gate having both a transfer and a storage region formed in the silicon under it. There are two voltage phase lines $\Phi_1$ and $\Phi_2$. The charge coupling concept is used in frame transfer and interline transfer CCD image sensing devices. An example of a frame transfer area image sensor 10 is shown in FIG. 1.

A schematic cross-section for a true two phase CCD is shown in FIG. 1a. A true two phase CCD is described in detail in commonly assigned U.S. Pat. No. 4,613,402 to Losee and Lavine. A true two phase CCD has storage and transfer regions beneath each phase gate. In FIG. 1a the phase gates are labeled by either first or second polycrystalline silicon (poly-Si), and the transfer and storage regions by regions (1) and (2) for $\Phi_1$ and (3) and (4) for $\Phi_2$. In this disclosure only n-buried channel devices will be considered. This invention applies equally to p-buried channel devices. For an n-channel CCD, which is illustrated, the buried channel is formed by an n-type doping in a p-type substrate or in a p-well in an n-type substrate. The transfer and storage buried channel regions are differentiated by less or more of the n-buried channel doping, respectively. U.S. Pat. No. 4,613,402 discloses a detailed procedure for making true two phase CCD devices.

The electrostatic potential band diagram through one of the phase gate electrodes, the buried channel and the substrate of an image pixel is shown in FIG. 2. The buried channel is shown reverse biased and with a positive gate voltage, Vg, to create a depleted surface. In this situation, the Fermi level ($E_F$), although not shown, will be near the middle of the band gap at the oxide-Si interface. In a buried channel CCD, dark current arises from three main sources: (1) generation from a mid-gap state resulting from either the disrupted lattice or an impurity at a depleted Si-SiO$_2$ interface, (2) generation in the depletion region as a result of an impurity or defect with a mid-gap state and (3) diffusion of electrons to the buried channel from the substrate. All three sources, result in spurious charges being collected as signal in the buried channel. The mechanism for dark current generation both at the surface and in the depletion region is illustrated in FIG. 2 and is as follows: A generation site (defect) emits an electron (negative charge) into the conduction band in the buried channel and a hole (positive charge) into the valence band. In both cases, the electron is captured by the buried channel as dark signal, and if the spatial region where the hole is emitted to the valence band is depleted of majority carriers then the holes will migrate away from their point of generation thus leaving the region depleted of majority carriers. A hole generated in the depletion region is driven to the substrate. A hole generated at the surface goes laterally to a channel stop region, again leaving the surface depleted of majority carriers. Since the state of the generation regions is now exactly the same as before the electron and hole emission events, the surface and depletion region defects continue to generate electron and hole pairs, thus acting as sources of dark current. This generation process ceases only if an excess of either electrons or holes develop in the region where the defect exists. Modern fabrication technology has reduced the concentrations of both defects in the depletion region and also defects leading to bulk current to such an extent that the surface state generation mechanism is the dominant source of dark current in buried channel CCDs.

Accordingly, it is an object of this invention to reduce this surface state component of dark current.

SUMMARY OF THE INVENTION

To accomplish the above object there is provided a method of reducing dark current in a buried channel CCD in which a pixel is defined by at least two adjacent electrodes, comprising the step of:

during the operation of such CCD simultaneously placing all electrodes in a mode of operation whereby holes are drawn to the channel to combine with the dark current electrons.

In accordance with this invention, dark current generation is very effectively suppressed by holding all phase gates in a mode of operation in which the gates are held at a potential whereby holes are drawn to the silicon/silicon dioxide interface for all but the time needed for the actual transfer of charge from one CCD stage to the next. In order to operate in this mode of operation, a voltage must be applied that attracts holes to the silicon-SiO$_2$ interface. Appropriate voltages for this mode of operation are negative and positive for n-and p-buried channel devices, respectively. The true two phase architecture is ideally suited to this mode of operation.

In accordance with this invention, the channel potentials beneath the barrier and storage regions must be chosen properly to avoid mixing of adjacent pixel signals when operating in the above described mode.

This invention is suitable for use in frame transfer CCD imagers during both integration and readout. It can also be applied to interline transfer CCD imagers during readout of the optically generated signal.

An advantage of operating a frame transfer CCD in the mode described hereinabove is to dramatically reduce the dark current during both integration and readout and the dark fixed pattern noise that accrues during integration. The dark current reduction translates into both increased dynamic range and reduced dark signal shot noise.

Another advantage of this invention is the capability to accommodate interlaced operation during both integration and readout in a frame transfer image sensor without loss of performance by performing a one half stage normal transfer following one of the fields to assure proper pixel alignment to avoid pixel mixing during subsequent accumulation periods.

BRIEF DESCRIPTION OF THE DRAWINGS

FIGS. 4a and 4b are graphs which respectively illustrate gate voltage vs. channel potential and gate voltage vs. dark current for a gate of FIG. 1a;

DESCRIPTION OF THE PREFERRED EMBODIMENT

Figure 1:
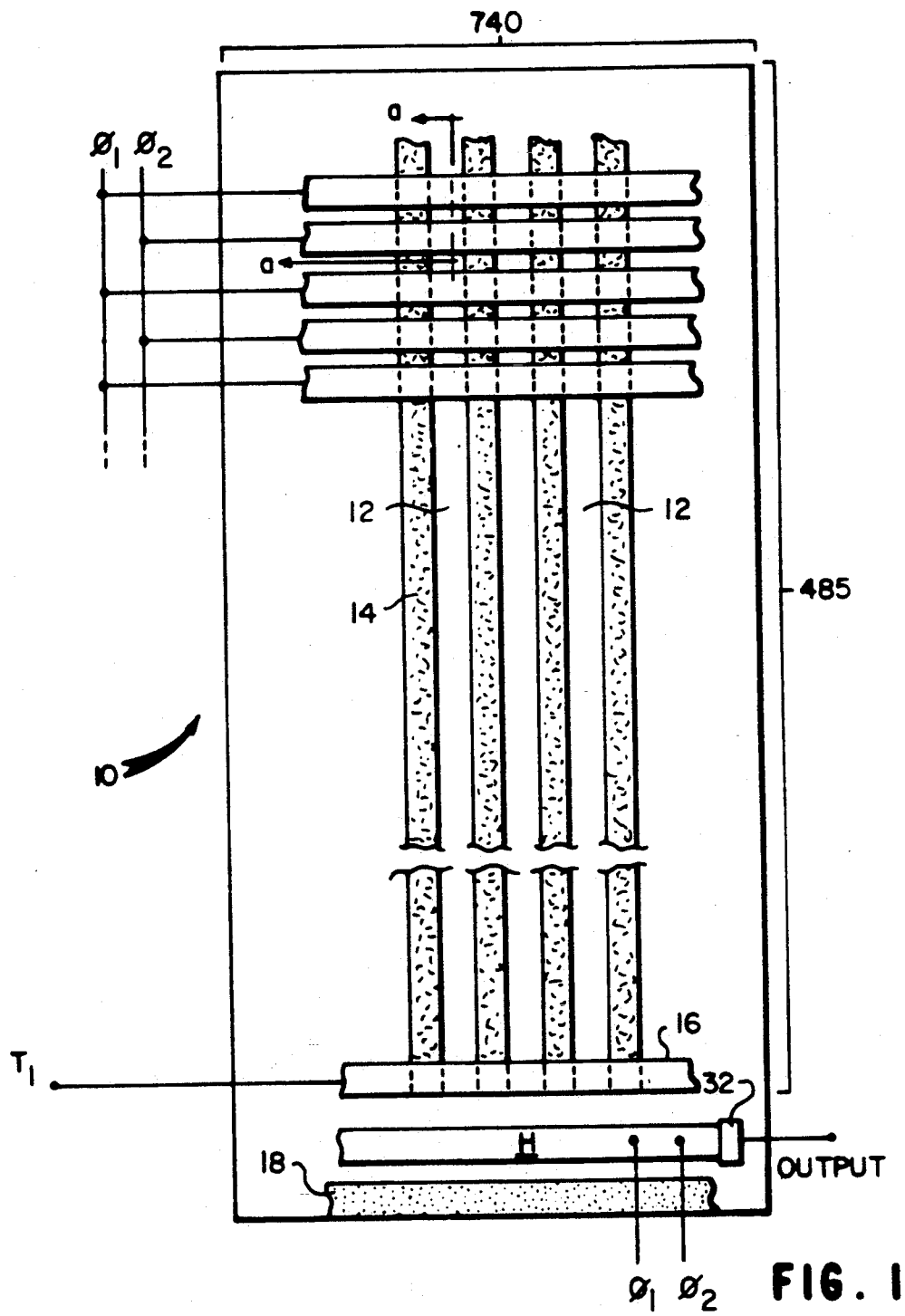
FIG. 1 is a schematic plan view of a true two phase area image sensor.

For illustrative purposes, the present invention is described with reference to a frame transfer CCD image sensor 10 as shown in FIG. 1. In this arrangement, charge transfer channels 12 run in vertical directions. Separating each transfer channel is a channel stop 14 which confines charge collected to the transfer channels and prevents charge leakage into adjacent channels. Each transfer channel 12 has a plurality of sensing elements or image pixels (or, for an interline transfer CCD, stages of the vertical shift register). Each pixel is defined by two closely spaced gates per pixel since this is a two phase device. The gate electrodes can be made from a transparent conductive material such as polysilicon. A potential is applied to each of the electrodes of each sensing element and a potential well or depletion region is formed under it. Charge, which is a function of scene brightness, is collected in the potential well. In a buried channel CCD, the electrodes are disposed on an insulator such as $SiO_2$. The insulator overlies the substrate. The substrate is doped and can be of a given conductivity type, for example, p-type for an n-channel device. For an n-buried channel device, the surface region near the insulator in the substrate is n-conductivity type and opposite to that of the bulk substrate and of such a concentration that when a predetermined potential is applied to the electrode, a potential well is formed within the substrate spaced from the insulator.

The image sensor 10 comprises a frame transfer true two phase CCD having voltage phase lines $\Phi_1$ and $\Phi_2$ and a buried channel. The pixels define a two dimensional array, which for illustrative purposes only, is shown to have 740 columns and 485 rows of pixels. Each transparent electrode is connected to one line or phase of a two phase voltage clock signal source. After exposure to incident light, the voltage signals on the phase lines are sequentially applied in the well known manner to the image sensing array to move the imagewise charge pattern formed in the pixels one row at a time to an output register shown as block H.

High frequency clock pulses drive the polysilicon gate electrodes to read out each of the rows of the image sensor at a rate determined by the particular application. The output register H is shown schematically as a block since it can be provided by a conventional two phase CCD shift register positioned between an optional transfer gate 16 and a horizontal channel stop 18. The transfer gate 16 may be one of the phase clocks of the vertical register. Each cell of the output register H has two gate electrodes aligned with a transfer channel. These electrodes are actuated by signals on voltage lines $\Phi_1$ through $\Phi_2$ in the conventional manner.

The transfer gate electrode 16 is actuated by a first transfer signal $T_1$ and transfers a row of photocharges to the output register H.

After a row of photocharges has been transferred to the output register H, the transfer gate 30 is closed. By being closed is meant that a potential barrier is formed under this transfer electrode. At this time, the output register is operated in a two phase manner, clocking the photocharge out to an output diode 32, one pixel at a time. The output diode 32 converts the photocharges into a voltage.

Before proceeding further, the mechanism for operating in a mode in accordance with the present invention will now be discussed. The generation of dark current due to surface generation sites can be significantly reduced if a voltage is applied to a gate electrode to accumulate holes under that electrode.

Figure 3A:
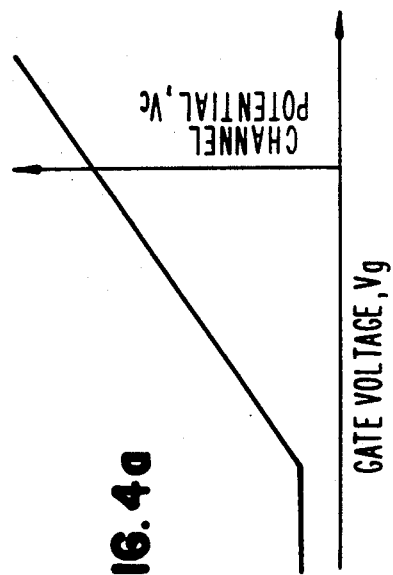
FIGS. 3a and 3b illustrate electrostatic potential band diagrams similar to FIG. 2 showing surface depletion mode of operation and the mode of operation where there is an accumulation of holes.

The mechanism underlying this effect will now be discussed. The accumulation of holes at the $Si-SiO_2$ interface suppresses further generation of dark current and can be understood as driving the reaction of producing electron hole pairs (previously discussed) in the reverse direction, i.e., hole capture by the defect rather than hole emission from the defect. The state of accumulation of holes at the $Si-SiO_2$ interface beneath any CCD phase gate can be controlled by the voltage, Vg, applied to the gate. As is well known in the physics of MOS devices, the hole density in the valence band is determined by the separation of the Fermi level, $E_F$, from the valence band, Ev. The density of holes increases dramatically when that separation becomes less than approximately ¼ the band gap, i.e., the separation between Ev and Ec. The separation is controlled by the gate voltage, $V_G$. In FIG. 3a, this separation is practically the entire band gap so the semiconductor surface just beneath the gate insulator is depleted of holes (majority carriers).

Figure 3B:
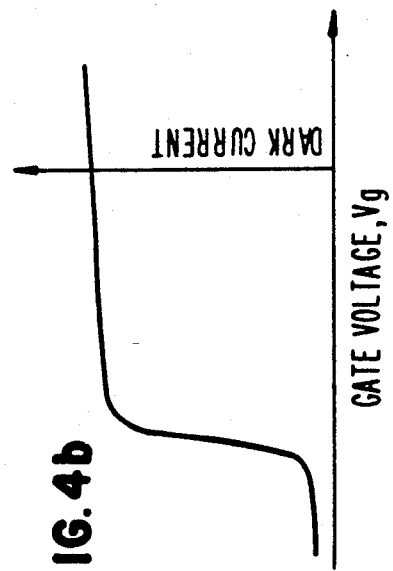
Figure 4A:
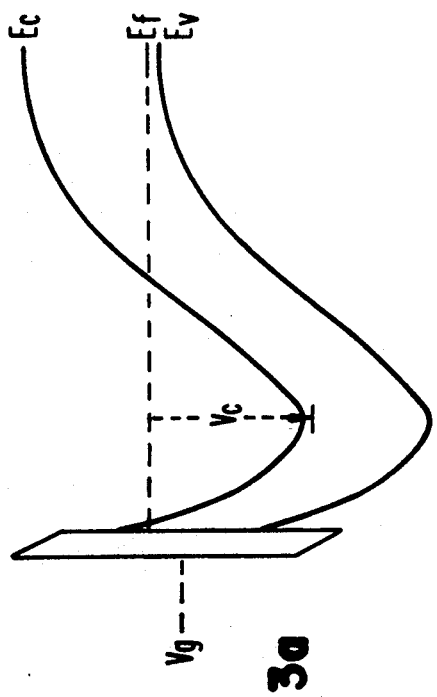
Figure 4B:
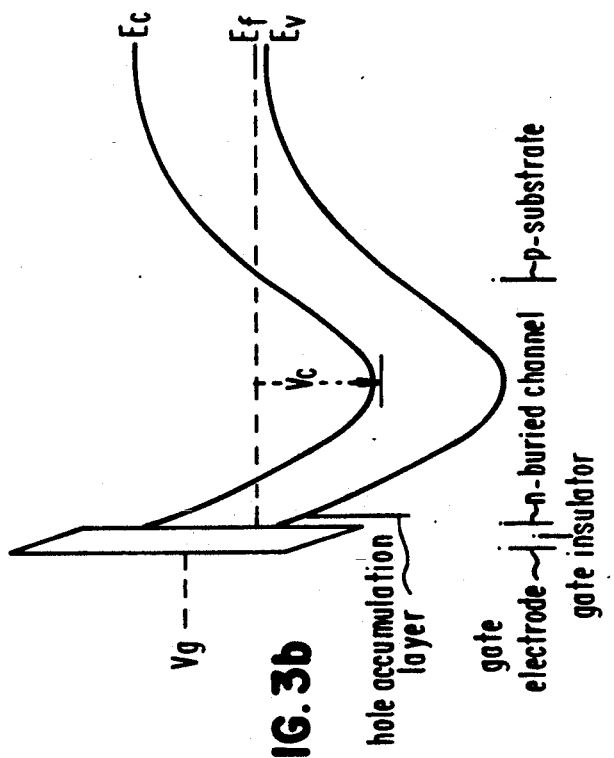

FIG. 3b illustrates the condition of sufficiently more negative gate voltage than for FIG. 3a such that holes are attracted to the $Si-SiO_2$ interface beneath the gate electrode. At even more negative gate voltages, $V_G$, the layer of holes shields the buried channel from the effects of the gate voltage. The gate is now accumulated with holes and the dark current drops to a low value. The channel potential, Vc, is the difference between the Fermi level for the substrate, $E_F$, and the Quasi Fermi level for the empty buried channel. The value of Vc is controlled by the gate voltage, $V_G$, until the gate voltage becomes sufficiently negative to accumulate the silicon surface beneath the gate insulator with holes, at which point $V_G$ no longer controls Vc. This is illustrated on FIGS. 4a and 4b. This transition occurs over a small gate voltage range. FIG. 4a shows the dark current reduction, and FIG. 4b shows the channel potential saturation when the surface is accumulated with holes.

Figure 1A:
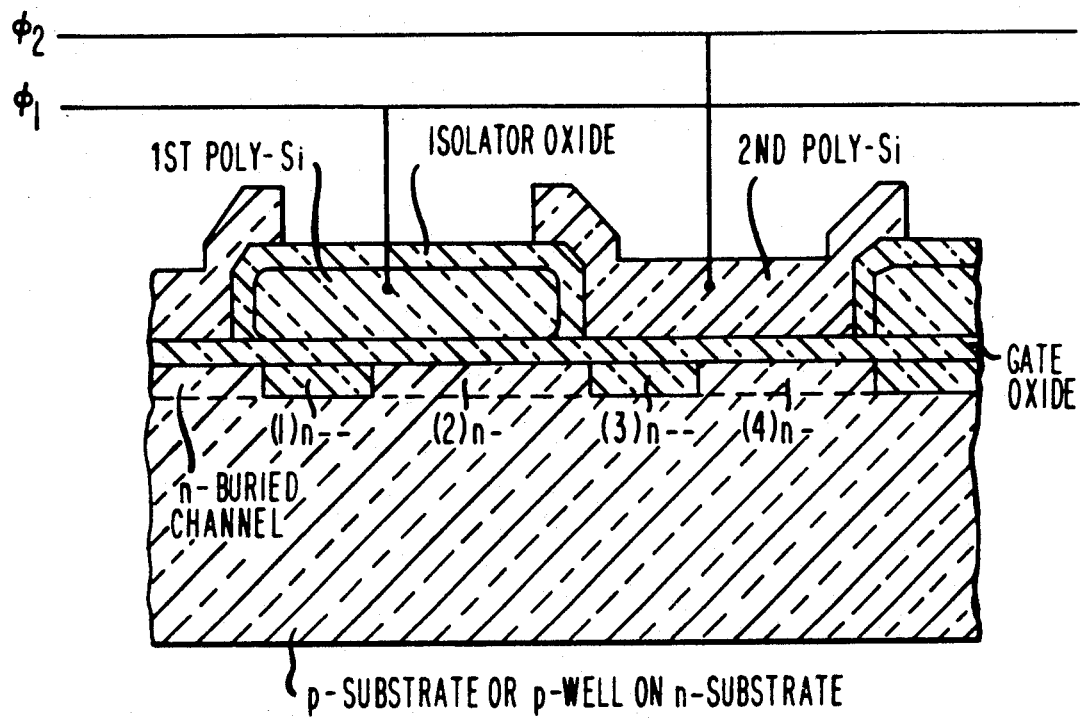
FIG. 1a is a fragmentary, partially schematic vertical sectional view taken along the lines a—a of the two phase CCD device of FIG. 1 showing an image pixel.
Figure 2:
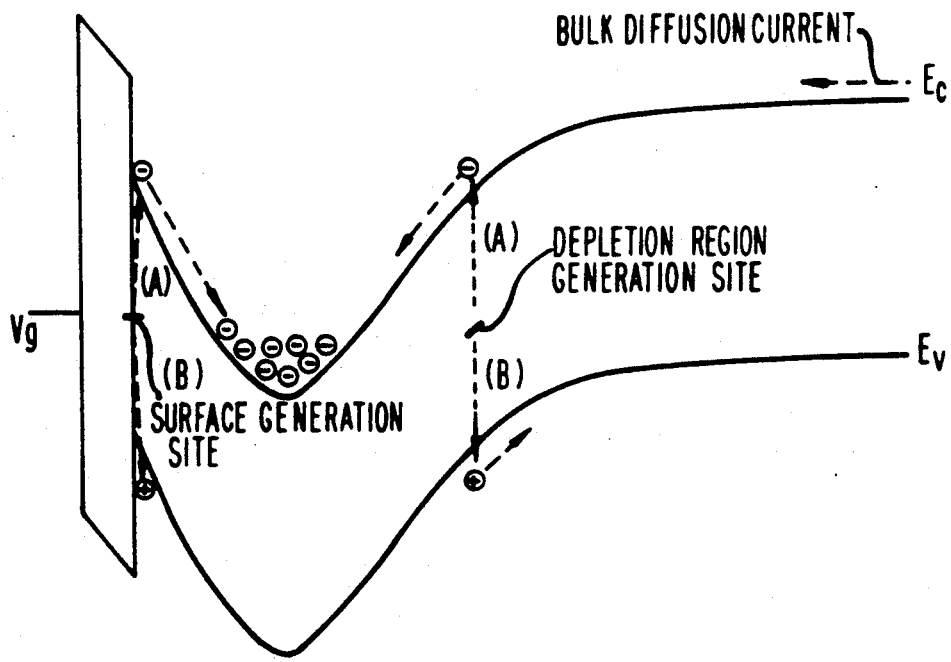
FIG. 2 is an electrostatic potential band diagram for the image pixel of FIG. 1a illustrating the mechanisms for the generations of dark current.
Figure 5:
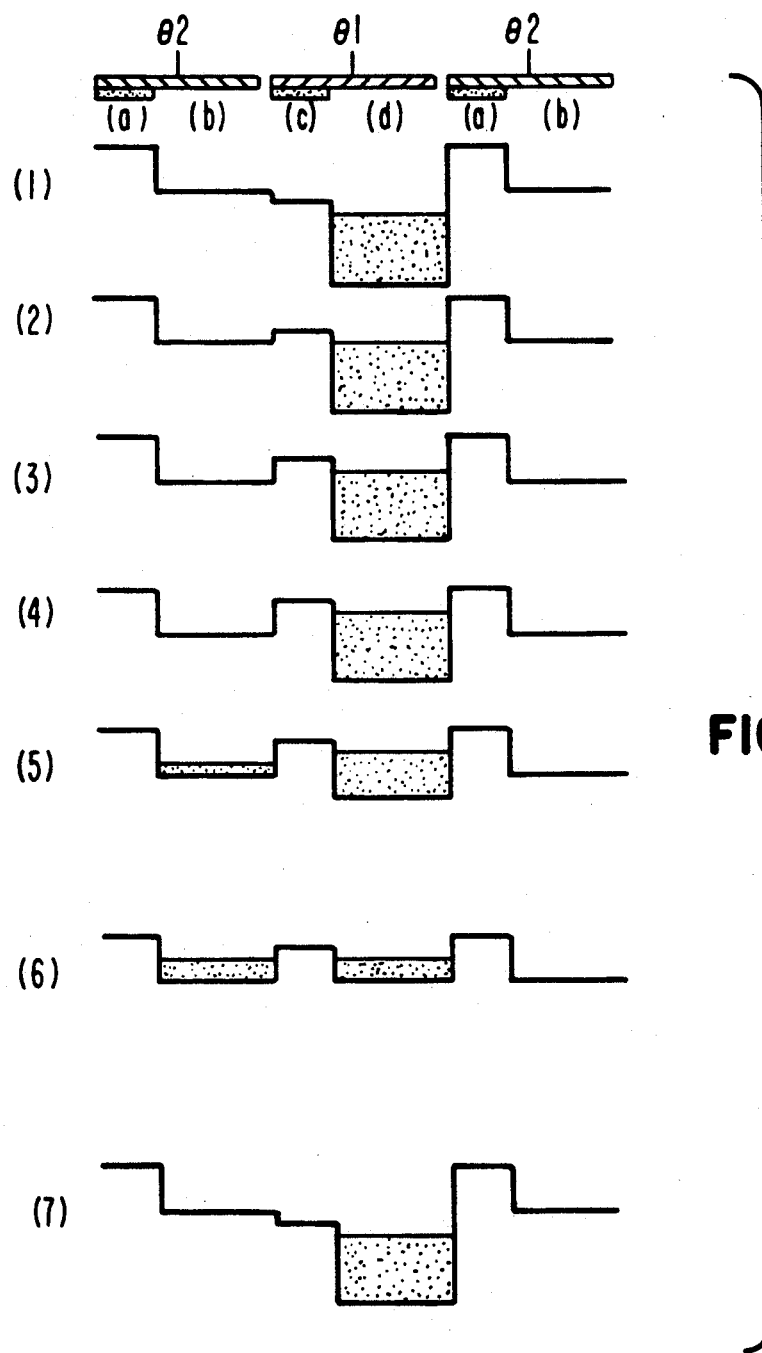
FIG. 5 schematically illustrates three gate electrodes of a true two phase CCD and potential wells under these gates when changing from the end of a transfer period through a mode of operating where holes are accumulated thereunder these gates.

Turning now to FIG. 5 where the operation of the CCD of FIG. 1 in accordance with a method of the present invention is illustrated. At the top of this FIG. is a schematic representation of 1 and ½ pixels of the true two phase CCD shift register. One pixel is comprised of two gates. For each gate, the regions labeled (a), (c), and (b) and (d) are the transfer and storage regions of the gate's buried channel. See also FIG. 1a. It is important to note as shown in FIG. 1a the transfer regions (a) and (c) are more lightly doped (n− −) than the storage regions (b) and (d) (n−). It should be noted that other means than doping differences could be employed to form the storage and transfer regions beneath a phase gate. One suitable method is a gate insulator thickness difference. The storage region could be fabricated with a thicker gate insulator than the transfer region, for example. Lines 1-7 show the channel potential (solid line) and the location of the signal charge (shaded) in a sequence of times as the phase one gates are clocked to a potential accumulation of holes occurs between stage-to-stage transfer down the CCD shift register. A discussion of the mode of operation where the accumulation of holes occurs during charge integration follows the discussion of that mode of operation during stage-to-stage transfer.

(A) Pixel-to-Pixel Transfer

Line 1: This is the voltage and signal charge configuration at the end of a normal stage-to-stage transfer down the CCD shift register. The voltage applied to phase line $\Phi_2$ is low and that applied to $\Phi_1$ is high. The signal charge resides in the storage well beneath the gates connected to $\Phi_1$. The surface component of the dark current is suppressed beneath the gate connected to $\Phi_2$. The dark current beneath the gate connected to $\Phi_1$ can also be suppressed by driving it to accumulate holes.

Lines 2-4: Begin to take phase line $\Phi_1$ low, i.e. toward the potential at which the accumulation of holes occurs. All the signal charge still resides beneath the gate connected to $\Phi_1$. At some voltage on phase line, $\Phi_1$, the transfer region reaches the potential at which the accumulation of holes occurs and this is the condition at line 4. At this point the channel potential in the transfer region saturates so that a further reduction in the $\Phi_1$ voltage results in no further reduction in the channel potential beneath the gate transfer region connected to $\Phi_1$.

Line 5: Because this transfer region is now at which the potential at which the accumulation of holes occurs, a further reduction of the $\Phi_1$ gate voltage results in a reduction in the channel potential of the storage region. As a consequence, the storage well begins to collapse, resulting in a decrease in the charge handling capacity of the $\Phi_1$ gate. The excess signal spills either backward or forward, depending on the relative channel potentials of phases 1 and 2. In this example, the channel potential is greater beneath $\Phi_1$, so the excess charge spills backward and is shown shaded beneath $\Phi_2$.

Line 6: The gate connected to $\Phi_1$ is now completely at the potential at which the accumulation of holes occurs and the signal is now shared between the pixel gates connected to $\Phi_1$ and $\Phi_2$. Both gates of each pixel are now simultaneously in the mode of operation at which accumulation of holes occurs. This is illustrated by the shaded areas. The surface contribution to the dark current is now suppressed. The channel potentials should be chosen so that the charge capacity is not dramatically reduced, i.e., the accumulated charge capacity beneath one phase should be no less than approximately ½ the charge capacity in the normal unaccumulated bias condition, as is shown in line 2, since in the accumulated condition the signal is shared between both pixel gates.

Line 7: At the time that a stage-to-stage charge transfer is to be made, the $\Phi_1$ voltage is increased and all the signal is held beneath the gate connected to $\Phi_1$ again. The normal clocking sequence is applied to transfer the charge from one stage to the next, leaving the signal beneath the $\Phi_1$ gate as shown in line 1, but transferred one full CCD stage along the shift register. The cycle of lines 1-6 can now be repeated to simultaneously again place both gates at the potential at which the accumulation of holes occurs to suppress the dark current between stage-to-stage transfer.

The preceding procedure can be applied during the readout of either a frame transfer or an interline transfer CCD. Such a procedure is applied to the phase gates of the vertical CCD during readout of the horizontal output register. The minimum dark current reduction depends on the fraction of the total frame readout time the phase gates are at the potential at which the accumulation of holes occurs. Furthermore, the dark current reduction may be larger if the holes are not emitted from the mid-gap states during the time the gates are not at the potential at which the accumulation of holes occurs during the stage-to-stage transfer along the CCD shift register.

(B) Integration

For the frame transfer architecture, the dark current can also be suppressed during integration, i.e., during the time that the sensor pixels are optically exposed. This is accomplished by biasing the gates as in line 6 of FIG. 5. The pixel must be defined just as in FIG. 5 to eliminate mixing of information between pixels. In FIG. 5 an image pixel is defined by the left gate connected to $\Phi_2$ and the middle gate connected to $\Phi_1$ since excess charge beneath one will spill into the other and therefore remain in the same pixel. The definition of a pixel is important if, for example, a color filter pattern is applied such that different colors occur in the same column. As in the case of accumulation of holes occurs during readout, for such operation during integration the potential channel potential at which this operation occurs in the transfer region for $\Phi_1$ gate must be more positive than the channel potential for such operation for the $\Phi_2$ gate.

Dark current reduction of 50 times have been noted at the potential at which the full accumulation of holes occurs at room temperature for true two phase, frame transfer CCD imagers.

Figure 6:
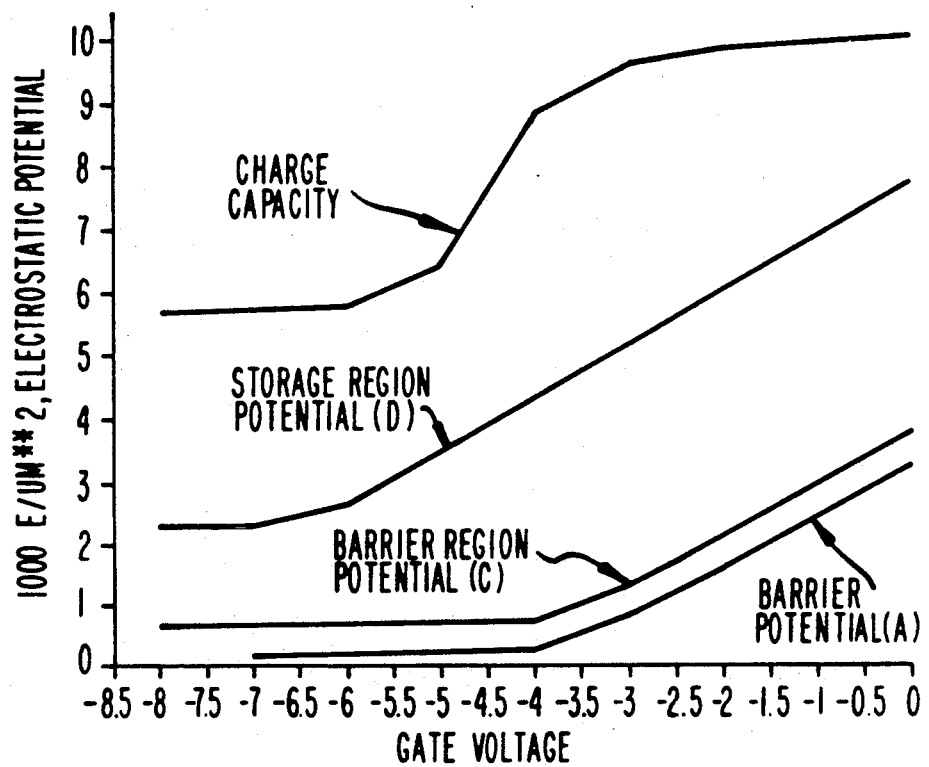
FIG. 6 illustrates the electrostatic potential maximum, in volts, vs gate voltage for a vertical cross-section through regions (a), (c) and (d) of FIG. 5, as well as the charge capacity in electrons/$\mu m^2$ vs gate voltage for region (d) of FIG. 5.

FIG. 6 shows the electrostatic potential for the transfer and storage region for the $\Phi_1$ gate, along with its charge capacity. These curves are calculated from a one dimensional electrostatics model. The charge capacity is determined to be the quantity of charge required to fill the storage region so that its electrostatic potential reaches to within ½ volt of the transfer region channel potential. The doping distribution in the storage region (d) is selected to yield an electrostatic potential of 7.75 volts at Vg=0 and an accumulation electrostatic potential (large negative Vg) of 2.3 volts. The transfer region (c) has an electrostatic potential of 3.75 volts at Vg=0 and an accumulation channel potential of 1.75 volts. The charge capacity is also shown on the same scale and is at Vg=0 is approximately 10,000 $e/\mu m^2$ (electrons per square micrometer). As the gate is reduced and the potential well collapses the charge capacity diminishes and at the potential at which the accumlation of holes occurs of both storage and transfer gates the charge capacity becomes approximately 5700 electrons/$\mu m^2$. In this state the excess charge is shared with the $\Phi_2$ gate, so the 10,000 electrons/$\mu m^2$ can easily be accommodated by the two regions of 5700 electrons/$\mu m^2$ each when both phases are accumulated to reduce the dark current. Therefore the saturation or maximum charge capacity of the CCD is not reduced by the mode of operation where the accumulation of holes occurs. The electrostatic potential of the $\Phi_2$ transfer region is also included on FIG. 6. It is designed to be approximately ½ volt less positive than $\Phi_1$ as required for a pixel definition as was discussed for FIG. 5. The experimentally measured channel potentials match the channel potential curves of FIG. 6, and the experimentally measured charge capacity is not diminished in the mode of operation at which the accumulation of holes occurs, which is consistent with the calculated charge capacity shown in FIG. 6.

The invention has been described in detail with particular reference to a true two phase CCD preferred embodiment thereof, but it will be understood that variations and modifications can be effected within the spirit and scope of the invention. For example, it is also applicable to a pseudo two phase device. In such a device each pixel has four electrodes but there are only two phase lines $\Phi_1$ and $\Phi_2$. The first two pixel electrodes are connected to $\Phi_1$ and the second two electrodes are connected to $\Phi_2$. One member of each pair becomes the storage region and the other member of each pair becomes the transfer region. The values of the channel potentials of the storage and transfer regions of each pair must be chosen as described above for the true two phase in order to properly define a pixel.

What is claimed is:

1. A method of reducing dark current during the operation of a two phase buried channel CCD having a repeating series of two gate pixels with the first pixel gate being connected to a phase line $O_1$ and the second pixel gate to a phase line $O_2$, the method comprising the step of:
    simultaneously applying appropriate voltages to both phase lines $O_1$ and $O_2$ so as to attract holes to the buried channel.

2. A method of reducing dark current during the operation of a two phase, buried channel CCD having a repeating series of two gate pixels with the first pixel gate being connected to a phase line $O_1$ and the second pixel gate being connected to a phase line $O_2$, each CCD buried channel gate having transfer and storage regions sequentially formed under each gate, the method comprising the step of:
    simultaneously applying voltages to both phase lines $O_1$ and $O_2$ so as to attract holes to the buried channel with the difference in channel potentials of the transfer regions so chosen that a given pixel signal is not mixed with signals contained in adjacent pixels.

3. A method of reducing dark current during the operation of a true two phase, buried channel CCD having a p-type substrate and an n-buried channel, with such CCD having a repeating series of two gate pixels with the first pixel gate being connected to a phase line $O_1$, and the second pixel gate to a phase line $O_2$, each CCD buried channel gate having transfer and storage regions sequentially formed under each gate, the method comprising the step of:
    simultaneously applying voltages to both phase lines $O_1$ and $O_2$ so as to attract holes to the buried channel with the difference in channel potentials of the transfer regions so chosen that a given pixel signal is not mixed with signals contained in adjacent pixels.

4. The method of claim 3 wherein charge is transferred from one pixel to another.

5. A method of reducing dark current during the operation of a true two phase, buried channel CCD having a p-type substrate and an n-buried channel, with such CCD having a repeating series of two gate pixels with the first pixel gate being connected to a phase line $O_1$, and the second pixel gate to a phase line $O_2$, each CCD buried channel gate having transfer and storage doping regions sequentially formed under each gate, and wherein the transfer regions are more lightly doped (n− −) than the storage regions (n−) so that a given pixel signal is not mixed with signals contained in adjacent pixels, comprising simultaneously applying voltages to both phase lines $O_1$ and $O_2$ so as to attract holes to the buried channel such that the difference in the channel potentials of the two transfer regions is so chosen that a given pixel signal is not mixed with signal contained in adjacent pixels.

6. The method of claim 5 wherein charge is transferred from one pixel to another.

* * * * *